(12) United States Patent
Gokhale et al.

(10) Patent No.: US 7,875,503 B2
(45) Date of Patent: Jan. 25, 2011

(54) REDUCING UNDERFILL KEEP OUT ZONE ON SUBSTRATE USED IN ELECTRONIC DEVICE PROCESSING

(75) Inventors: Shripad Gokhale, Chandler, AZ (US); Kathy Wei Yan, Chandler, AZ (US); Bijay S. Saha, Chandler, AZ (US); Samir Pandey, Phoenix, AZ (US); Ngoc K. Dang, San Diego, CA (US); Munehiro Toyama, Ibarakiken (JP)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 11/617,640

(22) Filed: Dec. 28, 2006

(65) Prior Publication Data

US 2008/0157352 A1      Jul. 3, 2008

(51) Int. Cl.
*H01L 21/56* (2006.01)
*H01L 21/58* (2006.01)

(52) U.S. Cl. ............... 438/118; 257/783; 257/E21.503

(58) Field of Classification Search ......... 438/106–127; 257/783
See application file for complete search history.

(56) References Cited

U.S. PATENT DOCUMENTS

| | | | |
|---|---|---|---|
| 5,866,952 A * | 2/1999 | Wojnarowski et al. | 257/788 |
| 5,885,854 A | 3/1999 | Wensel | 438/127 |
| 5,985,454 A * | 11/1999 | McMordie et al. | 428/413 |
| 6,000,416 A * | 12/1999 | Kingsford et al. | 137/1 |
| 6,048,656 A | 4/2000 | Akram et al. | 430/118 |
| 6,191,952 B1 * | 2/2001 | Jimarez et al. | 361/771 |
| 6,372,839 B1 | 4/2002 | Ito et al. | 524/493 |
| 6,784,530 B2 * | 8/2004 | Sugaya et al. | 257/686 |
| 6,816,385 B1 * | 11/2004 | Alcoe | 361/767 |
| 6,937,315 B2 | 8/2005 | Lee et al. | 349/153 |
| 6,998,007 B2 * | 2/2006 | Tukachinsky et al. | 156/272.2 |
| 7,015,591 B2 | 3/2006 | Lee | 257/786 |
| 7,015,592 B2 | 3/2006 | Starkston et al. | 257/787 |
| 7,317,257 B2 | 1/2008 | See et al. | 257/778 |
| 2005/0121310 A1 | 6/2005 | Yamada et al. | 204/192.12 |
| 2005/0224937 A1 | 10/2005 | Lee | 257/678 |
| 2007/0099346 A1 * | 5/2007 | Farooq et al. | 438/108 |

(Continued)

OTHER PUBLICATIONS

Extrand, The use of fluoropolymers to protect semiconductor materials Journal of Fluorine Chemistry, 122, 2003, pp. 121-124.*

(Continued)

*Primary Examiner*—David Vu
*Assistant Examiner*—Earl N Taylor
(74) *Attorney, Agent, or Firm*—Konrad Raynes & Victor LLP; Alan S. Raynes

(57) ABSTRACT

Electronic devices and methods for fabricating electronic devices are described. One method includes providing a substrate with a die attach area, and forming a layer on the substrate outside of the die attach area. The layer may be formed from a fluoropolymer material. The method also includes coupling a die to the substrate in the die attach area, wherein a gap remains between the die and the die attach area. The method also includes placing an underfill material in the gap and adjacent to the layer on the substrate. Examples of fluoropolymer materials which may be used include polytetrafluoroethylene (PTFE) and perfluoroalkoxy polymer resin (PFA). Other embodiments are described and claimed.

20 Claims, 5 Drawing Sheets

U.S. PATENT DOCUMENTS

| | | | |
|---|---|---|---|
| 2007/0134937 A1* | 6/2007 | See et al. | 438/775 |
| 2008/0026505 A1 | 1/2008 | Chakrapani et al. | 438/106 |
| 2008/0067502 A1* | 3/2008 | Chakrapani et al. | 257/40 |
| 2008/0142996 A1* | 6/2008 | Subramanian et al. | 257/788 |
| 2008/0150170 A1* | 6/2008 | Manepalli et al. | 257/795 |
| 2008/0237810 A1 | 10/2008 | Subramanian et al. | 257/629 |

OTHER PUBLICATIONS

Quere, D., "Non-sticking drops", Institute of Physics Publishing, Rep. Prog. Phys. 68, Sep. 7, 2005, pp. 2495-2532.

Bico, J., et al., "Pearl drops", Europhys. Lett. 47(2), Jul. 15, 1999, pp. 220-226.

Quere, D., "Rough ideas on wetting", Physica A 313, 2002, pp. 32-46.

Klein, R.J., et al., "Producing Super-Hydrophobic Surfaces with Nano-Silica Spheres", Materials Department, University of California, Santa Barbara, 2003, pp. 1-12.

Lafuma, A., et al., "Superhydrophobic states", nature materials vol. 2, Jun. 22, 2003, pp. 457-460.

* cited by examiner

REDUCING UNDERFILL KEEP OUT ZONE ON SUBSTRATE USED IN ELECTRONIC DEVICE PROCESSING

RELATED ART

Integrated circuits may be formed on semiconductor wafers made of materials such as silicon. The semiconductor wafers are processed to form various electronic devices. The wafers are diced into semiconductor chips, which may then be attached to a substrate using a variety of known methods. For example, bonding pads formed on the chip may be electrically coupled to the substrate using a variety of connection approaches, including, but not limited to, BGA (ball grid array), PGA (pin grid array), and LGA (land grid array). Such approaches couple the die to a substrate with a small gap therebetween.

FIGS. 1-3 illustrate certain operations in a conventional die attach process. As illustrated in FIG. 1, a die 10 is mounted on a substrate 12. In this example, the die 10 is mounted to the substrate 12 using a conventional BGA arrangement in a flip chip configuration, using a method known as a C4 process, in which solder bumps 14 are located between the die 10 and substrate 12. In a C4 process, the solder bumps 14 may be placed on pads on the active side of the die 10, on the substrate 12, or on both the die 10 and substrate 12. The solder bumps 14 are then melted and permitted to flow, to ensure that each bump fully wets the pad it was formed on. A flux may then be applied to at least one of the surfaces to be joined and the surfaces on the die 10 and substrate 12 are brought into electrical contact through the solder bumps 14. The flux acts to isolate the solder from the atmosphere and provides an adhesive force which acts to hold the die 10 and substrate 12 together. A second reflow operation is then carried out by heating the die 10 and substrate 12 to a temperature greater than the melting point of the solder, and a solder connection is made between the die 10 pads and the substrate 12 pads. The joined package is then cooled and the solder solidified. Excess flux residue may be removed in a defluxing operation, which may include chemical rinsing and heating operations. A material such as a polymer is then typically applied between the chip and substrate as an underfill encapsulant.

As illustrated in FIG. 1, a dispenser 16 such as a needle is positioned adjacent to the die 10, and an underfill material 18 is dispensed on the substrate 12 next to the die attach area (the area of the substrate 12 that is or will be covered by the die 10). The underfill material 18 is typically a polymer, for example, an epoxy. With the application of heat to the substrate and/or die, the underfill material 18 may be made to flow between the die 10 and substrate 12, using capillary action. When formed from a material such as a polymer epoxy, the underfill material 18 is then typically cured, to harden the polymer. The cured underfill material 18 surrounds the solder bumps 14 and acts to protect the bumps and connection between the die 10 and substrate 12, as well as support the die 10 on the substrate 12.

As seen in FIGS. 2-3, part of the underfill material 18 extends on the substrate beyond the die attach area to the sides of the die 10, and includes a tongue region 24, which is on the side or sides where the underfill material 18 was dispensed, and a side spread region 26. The underfill material 18 typically extends a distance up the side surfaces of the die 10. As seen in the example illustrated in FIG. 3, the tongue region 24 extends away from the side surface 10a of the die 10, and side spread regions 26, 28, and 30 extend away from the side surfaces 10b, 10c, and 10d of the die 10.

BRIEF DESCRIPTION OF THE DRAWINGS

Embodiments are described by way of example, with reference to the accompanying drawings, which are not drawn to scale, wherein.

DETAILED DESCRIPTION

Figure 1:
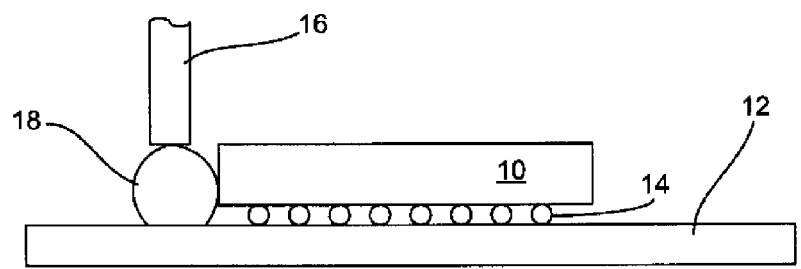
FIG. 1 illustrates a side cross-sectional view of a conventional processing operation in which an underfill material is dispensed on a substrate.
Figure 2:
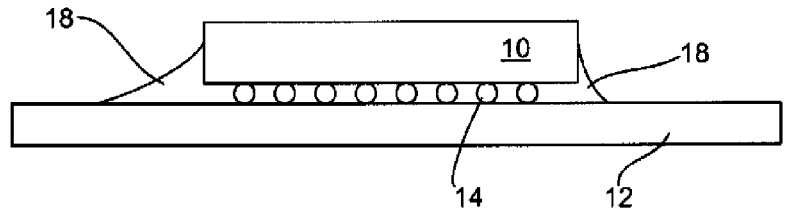
FIG. 2 illustrates a side cross-sectional view of a conventional processing operation in which an underfill material is positioned between the die and substrate and extends on the substrate beyond the area covered by the die.
Figure 3:
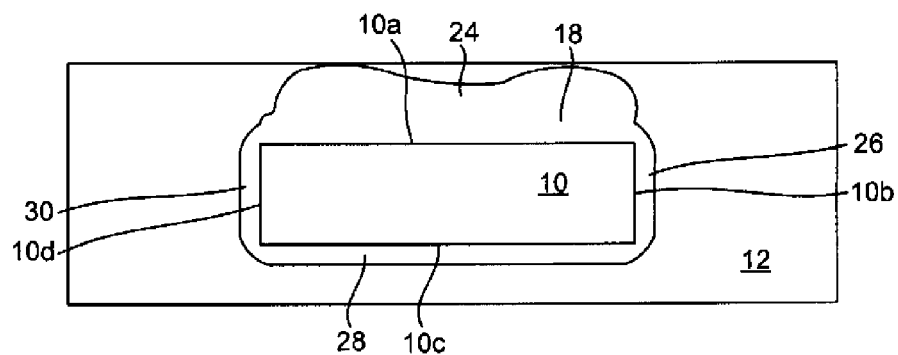
FIG. 3 illustrates a top view of a conventional processing operation including an underfill material extending to a tongue region and side spread regions.
Figure 4:
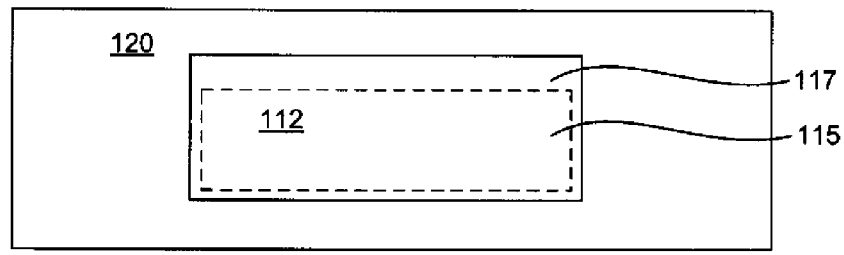
FIGS. 4-7 illustrate views of processing operations including the positioning of a low surface energy material layer on a substrate and the positioning of an underfill material in a tongue region and in side spread regions, in accordance with certain embodiments.

The outward flow from the die attach area to create the tongue and side spread regions as illustrated in FIGS. 2-3 can lead to certain problems due to the large surface area that becomes covered with the underfill material. Such problems may relate to interactions between the underfill material and other structures, for example, when the substrate is small as in ultra small form factors, and when die side capacitors are mounted on the die side of the substrate. As a result, the underfill keep out zone on the substrate (the area where other structures are kept out due to the spread of the underfill material beyond the die attach area) may be undesirably large.

Certain embodiments relate to the formation of electronic assemblies, in which the flow of underfill material outside of the die attach area is controlled. Certain embodiments may include electronic assemblies. Certain embodiments may also include methods for forming electronic assemblies.

FIGS. 4-7 illustrate views of an electronic assembly during several stages of processing, in accordance with certain embodiments. As seen in the top view of FIG. 4, a low surface energy material layer 120 is formed on a portion of the surface of substrate 112. A die attach area 115 is bounded by the dotted lines in FIG. 4. The die attach area 115 is the area on the substrate that will be covered by the die 110 (when viewed from above the die) when the die 110 is coupled to the substrate 112. The region 117 (outside of the die attach area 115 bounded by the dotted line but inside of the low surface energy material layer 120) is where a tongue region 124 and side spread regions 126, 128, and 130 will be formed (see FIG. 7) on the substrate during subsequent processing.

Figure 5:
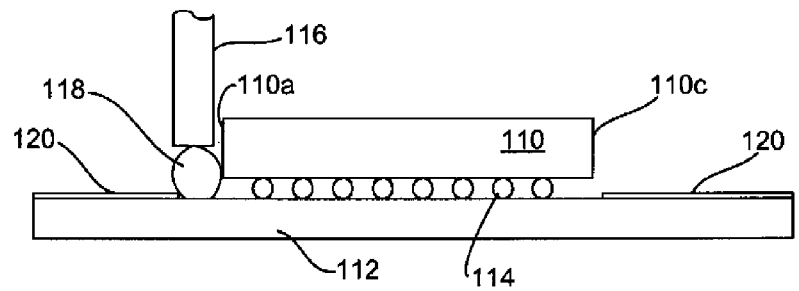

As seen in FIG. 5, a dispenser 116 such as a needle is positioned adjacent to the die 110, which is coupled to the substrate 112 through solder bumps 114. An underfill material 118 is dispensed on the substrate 112, next to the die attach area. The underfill material 118 will flow between the die 110 and substrate 112, for example, through the use of heat induced capillary action. The substrate 112 also includes the low surface energy material layer 120 formed thereon. The low surface energy material layer 120 is positioned outside of the die attach area 115. The low surface energy material layer 120 is formed from material having a low surface energy and having the ability to inhibit the flow of the underfill material 118. As a result, when the underfill material is flowed between the die and substrate (for example, through the use of heat induced capillary action), the low surface energy material layer 120 inhibits the continued outward flow of the underfill material 118.

Examples of low surface energy materials include, but are not limited to, fluoropolymer materials (polymer which have a fluorinated carbon). One example is a family of materials that are sold under the trade name Teflon, (available from DuPont). One material sold under the trade name Teflon is known as PTFE (polytetrafluoroethylene). A basic PTFE chemical structure is set forth in Table 1 below, where C is carbon, F is fluorine, and n is a variable. Another material sold under the trade name Teflon is known as PFA (perfluoroalkoxy polymer resin). A basic PFA structure is set forth in Table 1 below, wherein C is carbon, F is fluorine, O is oxygen, and m and n are variables.

TABLE 1

Low Surface Energy Materials

| Structure | Name |
|---|---|
| $-(\underset{\underset{F}{\mid}}{\overset{\overset{F}{\mid}}{C}}-\underset{\underset{F}{\mid}}{\overset{\overset{F}{\mid}}{C}})_n-$ | PTFE |
| $-(\underset{\underset{F}{\mid}}{\overset{\overset{F}{\mid}}{C}}-\underset{\underset{F}{\mid}}{\overset{\overset{F}{\mid}}{C}})_m-$ | PFA |

PTFE and PFA have non-stick properties, have minimal surface reactive properties, and have a melting point of about 300° C., which is generally not detrimental to electronic assembly processes. Due to the low surface energy, these materials will inhibit the underfill material from wetting their surface and thus inhibit the underfill from sticking thereto. As a result, the spreading of the underfill material over the substrate surface can be controlled because it will be inhibited from flowing over the low surface energy material. The low surface energy material may be positioned to permit whatever amount of spreading of the underfill material is desired. For example, in certain applications, it may be useful to have the underfill material spread a small, uniform distance outward from the die attach area, for protection. In other applications it may be useful to minimize or have no underfill spread beyond the die attach area, or to provide for different amounts of underfill spread on different sides of the die attach area.

Figure 6:
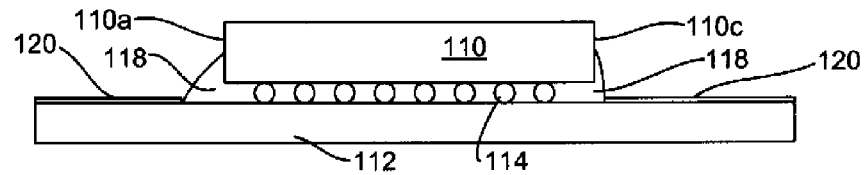
Figure 7:
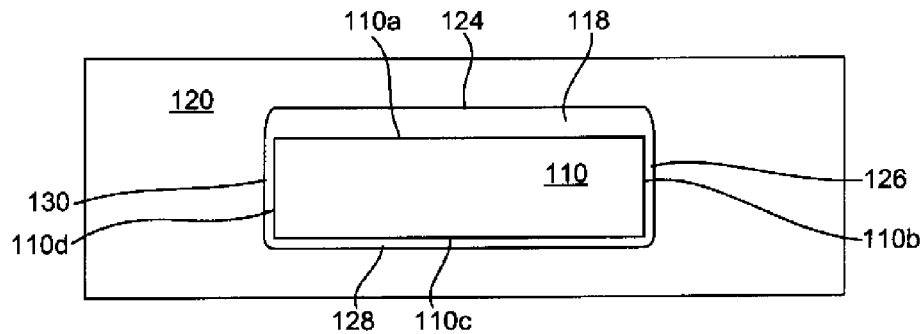

As illustrated in the embodiment shown in FIGS. 4-7, the low surface energy material layer 120 is positioned a first distance outside of the die attach area 115 on one side of the die attach area and is positioned a further distance outside of the die attach area on the other three sides of the die attach area 115. As a result there will be a larger (but uniform) spread on one side, which is in this embodiment the side that the underfill material 118 is dispensed on (the tongue region), as seen in FIG. 5. The other three sides outside of the die attach area 115 will each have a small and uniform side spread region, as illustrated in FIG. 7.

FIG. 6 shows the underfill material 118 after it has flowed between the die 110 and substrate 112. The underfill material 118 has not flowed over the low surface energy material layer 120. In certain embodiments, it is desired that the underfill material 118 spreads at least a distance up the side surfaces of the die 110. For instance, as illustrated in FIG. 6, the underfill material 118 spreads about half way up the illustrated side surfaces 110a and 110c of the die 110.

As illustrated in FIG. 7, when viewed from above, such a design enables the underfill material to spread outward on the substrate 112 from the sides 110a, 110b, 110c, and 110d of the die 110. As illustrated in the embodiment of FIG. 7, the tongue region 124 extending on the substrate 112 outward from die side 110a is larger than the side spread regions extending on the substrate 112 outward from the die sides 110b, 110c, and 110d. In this embodiment, the tongue region 124 and side spread regions 126, 128, 130 extending on the substrate outward from the die sides 110b, 110c, and 110d, are substantially smaller than those illustrated in the conventional approach illustrated in FIG. 3.

It should be appreciated that the exact position and shape of the low surface energy material layer 120 may be varied from that shown in FIGS. 4-7. Depending on factors including, for example, the size of the substrate and the presence of other structures on the substrate, the underfill keep out zone can be configured to any desired shape and any desired size outside of the die attach area (even down to zero on all sides), by controlling the location, shape and size of the low surface energy material formed outside of the die attach area.

Figure 8:
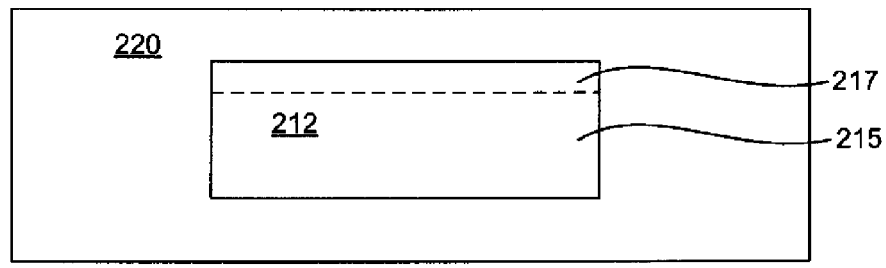
FIG. 8-11 illustrate views of processing operations including the positioning of a low surface energy material layer on a substrate and the positioning of the underfill material in a tongue region, in accordance with certain embodiments.
Figure 9:
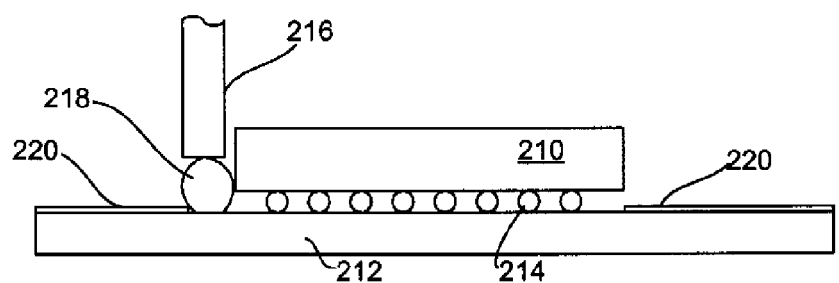
Figure 10:
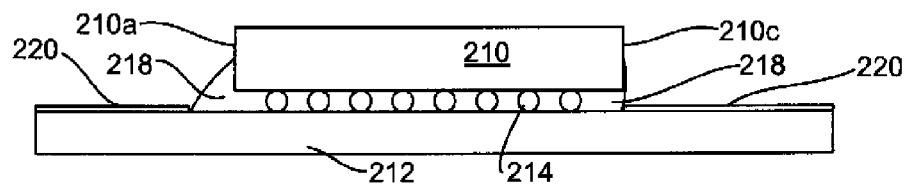

For example, in another embodiment, the low surface energy material layer may be positioned a distance outside of the die attach area on one side only, as illustrated in FIGS. 8-11. FIG. 8 shows the low surface energy material layer 220 positioned a distance outside of the die attach area 215 on only one side of the die attach area 215, so that a small region 217 outside of the die attach area 215 is not covered by the low surface energy material layer 220. Region 217 is where the underfill will flow to form a tongue region. FIG. 9 illustrates a die 210 coupled to a substrate 212 through bumps 214. A dispenser 216 dispenses an underfill material 218 onto the surface of the substrate 212 adjacent to the die 210. FIG. 10 illustrates the flow of the underfill material 218 under the die and into the region outside of the die attach area 215 that is not covered with the low surface energy material layer 220.

Figure 11:
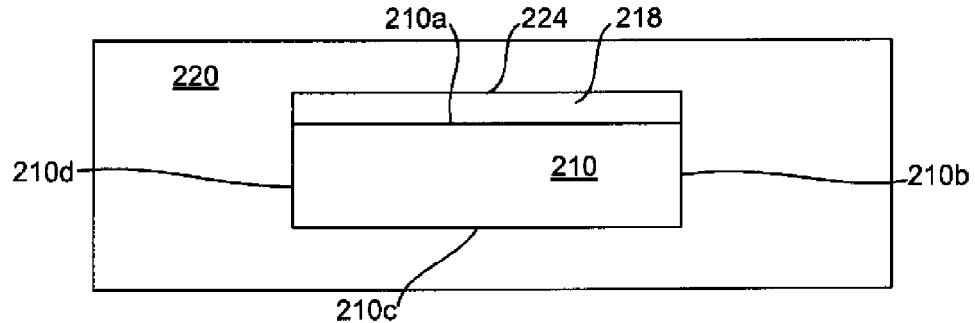

FIG. 11 shows a top view of the position of the flowed underfill material on the substrate 212. As seen in FIG. 11, the tongue region 224 has a controlled and uniform shape and is substantially smaller than that illustrated in the conventional assembly illustrated in FIG. 3. In addition, as seen in FIG. 11, there is no side spread extending outward on the substrate 112 from the sides 210b, 210c, and 210d of the die 210, unlike in the conventional assembly illustrated in FIG. 3, which shows side spread regions 26, 28, and 30 extending outward on the substrate 12. Any underfill material that is spread up the sides 210b, 210c, and 210d of the die 210 (such as the underfill shown extending up the side surface 210c in FIG. 10), is not shown in FIG. 11.

Figure 12:
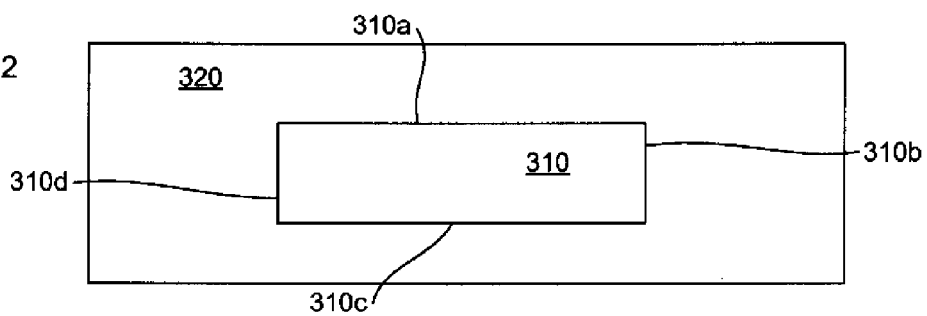
FIG. 12 illustrates a top view showing no underfill material spread outwards on the substrate to the sides of the die, in accordance with certain embodiments.

Another embodiment includes positioning the low surface energy material layer so that there is no tongue and no side spread formed on the substrate on any of the sides of the die attach area. Such an embodiment is illustrated in the top view FIG. 12, which shows that when viewed from above, the low surface energy material layer 320 is positioned to the edge of the die attach area, and thus there is no tongue region and no side spread regions extending outward on the substrate from the side surfaces 310a, 310b, 310c, and 310d of the die 310. It should also be appreciated that the die attach area may have multiple configurations, for example, more or less than 4 sides, depending on the shape of the die.

Figure 13:
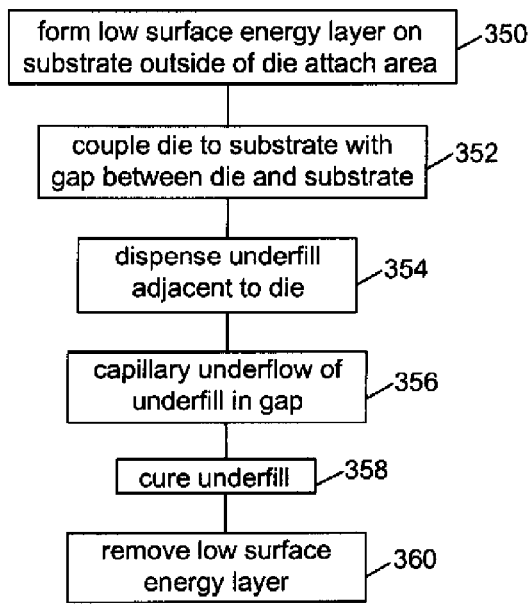
FIG. 13 illustrates a flow chart of an assembly process, in accordance with certain embodiments.

FIG. 13 is a flow chart showing a number of operations in accordance with certain embodiments. Box 350 is forming a low surface energy material layer on a substrate, outside of a die attach area. As described in the embodiments above, the low surface energy material may be positioned so that there will occur a desired amount of underfill material spread on the substrate, ranging from zero spread on all sides of the die attach area, to spread on all sides of the die attach area. Box 352 is coupling a die to the substrate in the die attach area, leaving a gap between the die and the substrate. In certain embodiments, the gap includes a plurality of solder bumps. Box 354 is dispensing an underfill material adjacent to the die on the substrate. Box 356 is filling the gap between the die and substrate with the underfill material, using a method such as capillary action. Where a material such as a polymer epoxy is used as the underfill material, Box 358 is curing the polymer epoxy. Box 360 is removing the low surface energy material layer. Various modifications to the above operations may be made, with certain operations being optional. For example, in certain embodiments, the low surface energy material layer is not removed from the substrate after the polymer is cured.

Figure 14:
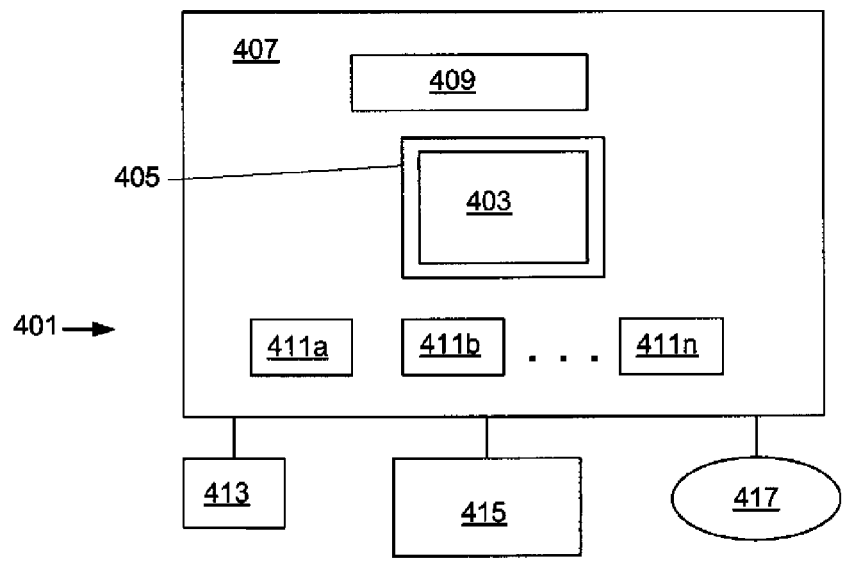
FIG. 14 illustrates an electronic system arrangement in which embodiments may find application.

Assemblies including a substrate and die joined together as described in embodiment above may find application in a variety of electronic components. FIG. 14 schematically illustrates one example of an electronic system environment in which aspects of described embodiments may be embodied. Other embodiments need not include all of the features specified in FIG. 14, and may include alternative features not specified in FIG. 14.

The system 401 of FIG. 14 may include at least one central processing unit (CPU) 403. The CPU 403, also referred to as a microprocessor, may be a die which is attached to an integrated circuit package substrate 405, which is then coupled to a printed circuit board 407, which in this embodiment, may be a motherboard. The CPU 403 on the package substrate 405 is an example of an electronic device assembly that may be formed in accordance with embodiments such as described above. A variety of other system components, including, but not limited to memory and other components discussed below, may also include die and substrate structures formed in accordance with the embodiments described above.

The system 401 further may further include memory 409 and one or more controllers 411a, 411b . . . 411n, which are also disposed on the motherboard 407. The motherboard 407 may be a single layer or multi-layered board which has a plurality of conductive lines that provide communication between the circuits in the package 405 and other components mounted to the board 407. Alternatively, one or more of the CPU 403, memory 409 and controllers 411a, 411b . . . 411n may be disposed on other cards such as daughter cards or expansion cards. The CPU 403, memory 409 and controllers 411a, 411b . . . 411n may each be seated in individual sockets or may be connected directly to a printed circuit board. A display 415 may also be included.

Any suitable operating system and various applications execute on the CPU 403 and reside in the memory 409. The content residing in memory 409 may be cached in accordance with known caching techniques. Programs and data in memory 409 may be swapped into storage 413 as part of memory management operations. The system 401 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 411a, 411b . . . 411n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 413 in accordance with a storage protocol layer. The storage protocol of the layer may be any of a number of known storage protocols. Data being written to or read from the storage 413 may be cached in accordance with known caching techniques. A network controller can include one or more protocol layers to send and receive network packets to and from remote devices over a network 417. The network 417 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
providing a substrate with a die attach area;
forming a layer on the substrate outside of the die attach area, wherein the layer is not positioned in the die attach area;
coupling a die to the substrate in the die attach area, wherein a gap remains between the die and the die attach area;
placing an underfill material in the gap;
after the placing the underfill material in the gap, curing the underfill material; and
removing the entire layer from the substrate after the curing the underfill material;
wherein the layer is formed from a material having a surface energy that inhibits the underfill material from wetting the layer, the material comprising a polymer.

2. The method of claim 1, wherein the layer is formed from a material comprising a fluoropolymer.

3. The method of claim 2, wherein the layer is formed from a material selected from the group consisting of polytetrafluoroethylene (PTFE) and perfluoroalkoxy polymer resin (PFA).

4. The method of claim 1, wherein the die attach area is rectangular in shape when viewed from above, and wherein the layer is formed to extend to the edge of the die attach area on three of the four sides of the rectangular die attach area.

5. The method of claim 1, wherein the layer is polytetrafluoroethylene (PTFE).

6. The method of claim 1, wherein the layer is perfluoroalkoxy polymer resin (PFA).

7. A method comprising:
providing a substrate with a die attach area;
forming a layer on the substrate outside of the die attach area, the layer comprising a fluoropolymer material, wherein the layer is not positioned in the die attach area;
coupling a die to the substrate in the die attach area, wherein a gap remains between the die and the die attach area;
placing an underfill material in the gap and adjacent to the layer on the substrate;
after the placing an underfill material in the gap and adjacent to the layer on the substrate, hardening the underfill material; and
removing the entire layer after the hardening the underfill material.

8. The method of claim 7, wherein the fluoropolymer material is selected from at least one of the group consisting of polytetrafluoroethylene (PTFE) and perfluoroalkoxy polymer resin (PFA).

9. The method of claim 7, wherein the fluoropolymer material comprises perfluoroalkoxy polymer resin (PFA).

10. The method of claim 7, wherein the layer comprises polytetrafluoroethylene (PTFE).

11. The method of claim 7, wherein die attach area is rectangular in shape when viewed from above, and wherein the layer is spaced apart from an edge of the die attach area on at least one of the four sides of the rectangular die attach area.

12. The method of claim 7, wherein the die attach area is rectangular in shape when viewed from above, and wherein the layer is formed to extend to the edge of the die attach area on at least three of the four sides of the rectangular die attach area.

13. A method comprising:
forming a layer on a substrate, the layer comprising a fluoropolymer material;
after the forming the layer on the substrate, coupling a die to the substrate through a plurality of solder bumps;
wherein a gap remains between the die and the substrate;
wherein the layer is not positioned between the substrate and the die;
after the coupling the die to the substrate, placing an underfill material in the gap between the die and the substrate; and
removing the entire layer after the placing the underfill material in the gap.

14. The method of claim 13, wherein the layer comprises perfluoroalkoxy polymer resin (PFA).

15. The method of claim 13, wherein the layer comprises polytetrafluoroethylene (PTFE).

16. The method of claim 1, wherein the die attach area is rectangular in shape when viewed from above, and wherein the layer is positioned a different distance away from the die attach area on at least two sides of the rectangular die attach area.

17. The method of claim 7, wherein the die attach area is rectangular in shape when viewed from above, and wherein the layer is positioned a different distance away from the die attach area on at least two sides of the rectangular die attach area.

18. The method of claim 7, wherein die attach area is rectangular in shape when viewed from above, and wherein the layer is spaced apart from an edge of the die attach area a different distance on different sides of the rectangular die attach area.

19. The method of claim 13, wherein the layer is positioned so that after curing, the underfill is positioned to extend outward from the gap between the die and the substrate.

20. The method of claim 13, wherein the layer is positioned so that the underfill does not extend outward from the gap between the die and the substrate on at least one side of the gap between the die and the substrate.

* * * * *